United States Patent
Yu et al.

(10) Patent No.: US 10,278,282 B2
(45) Date of Patent: Apr. 30, 2019

(54) SUBSTRATE STRUCTURE AND MANUFACTURING METHOD THEREOF

(71) Applicant: Phoenix Pioneer Technology Co., Ltd., Hsinchu County (TW)

(72) Inventors: Chun-Hsien Yu, Hsinchu County (TW); Hsien-Ming Tsai, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 1 day.

(21) Appl. No.: 15/392,803

(22) Filed: Dec. 28, 2016

(65) Prior Publication Data

US 2017/0208683 A1    Jul. 20, 2017

(30) Foreign Application Priority Data

Jan. 20, 2016  (TW) ............................. 105101675 A (51) Int. Cl.
| H05K 1/02 | (2006.01) |
|---|---|
| H05K 1/11 | (2006.01) |
| H05K 1/03 | (2006.01) |
| H05K 3/46 | (2006.01) |

(52) U.S. Cl.
CPC ........... *H05K 1/0298* (2013.01); *H05K 1/028* (2013.01); *H05K 1/0353* (2013.01); *H05K 1/11* (2013.01); *H05K 3/4608* (2013.01); *H05K 3/4644* (2013.01)

(58) Field of Classification Search
CPC ... H05K 3/0061; H05K 1/0058; H05K 1/0061
See application file for complete search history.

(56) References Cited

U.S. PATENT DOCUMENTS

| 5,266,746 A * | 11/1993 | Nishihara ............... H05K 1/118 174/254 |
|---|---|---|
| 9,214,437 B1 | 12/2015 | Hsu et al. |
| 9,370,105 B2 | 6/2016 | Hsu et al. |
| 2011/0019126 A1* | 1/2011 | Choi .................... H05K 1/0206 349/61 |
| 2012/0314369 A1* | 12/2012 | Wu ....................... H01L 23/427 361/701 |

FOREIGN PATENT DOCUMENTS

| TW | 201601227 | 1/2016 |
|---|---|---|
| TW | 201601266 | 1/2016 |

* cited by examiner

*Primary Examiner* — Hoa C Nguyen
(74) *Attorney, Agent, or Firm* — McClure, Qualey & Rodack, LLP (57) ABSTRACT

A substrate structure and a manufacturing method thereof are provided. The substrate structure comprises a metal carrier, a dielectric material layer, a first conductive wiring layer, a second conductive wiring layer and a conductive pillar layer. The first conductive wiring layer is disposed on a surface of the metal carrier. The dielectric material layer is disposed on a surface of the first conductive wiring layer. The conductive pillar layer is disposed inside the dielectric material layer, and located between the first conductive wiring layer and the second conductive wiring layer. The conductive pillar layer has at least one conductive pillar. The conductive pillar is electrically connected to the first conductive wiring layer and the second conductive wiring layer.

9 Claims, 12 Drawing Sheets

SUBSTRATE STRUCTURE AND MANUFACTURING METHOD THEREOF

CROSS REFERENCE TO RELATED APPLICATIONS

This Non-provisional application claims priority under 35 U.S.C. § 119(a) on Patent Application No. 105101675 filed in Taiwan on Jan. 20, 2016, the entire contents of which are hereby incorporated by reference.

BACKGROUND

1. Technical Field

This invention relates to a substrate structure and a manufacturing method thereof, in particular, to a semiconductor substrate structure and a manufacturing method thereof.

2. Description of Related Art

The rigid-flexible circuit board is one of the semiconductor packaging technologies that may integrate more electronic components in a limited space to increase the integrated density or reduce the package volume. The manufacturing method of the rigid-flexible circuit board can divide into at least two types. One of the manufacturing methods is forming the rigid-flexible circuit board by combining a printed circuit board with a flexible circuit board using a lamination procedure. Another one of the manufacturing methods is combining a printed circuit board with a flexible circuit board, which are the finished products, using a connection procedure.

As mentioned above, the complex circuit layout, the complex process, the complex material and the higher costs is the weakness in the technology of the rigid-flexible circuit board.

Therefore, it is an important subject to provide a substrate structure and its manufacturing method having rigidity and heat dissipation and meeting the fine line spacing, high-density, thinning tendency, low-cost and high electric characteristics.

SUMMARY OF THE INVENTION

In view of the foregoing, the present invention is to provide a substrate structure and its manufacturing method having rigidity and heat dissipation and meeting the fine line spacing, high-density, thinning tendency, low-cost and high electric characteristics.

To achieve the above, a substrate structure includes a metal carrier, a first conductive wiring layer, a first dielectric layer, a second conductive wiring layer and a first conductive pillar layer. The first conductive wiring layer is disposed on a surface of the metal carrier. The first dielectric layer is disposed on a surface of the first conductive layer. The first conductive pillar layer, which has at least a conductive pillar, is disposed inside the first dielectric layer and between the first conductive wiring layer and the second conductive wiring layer. The first conductive pillar layer is electrically connected to the first conductive wiring layer and the second conductive wiring layer.

To achieve the above, a manufacturing method of a substrate structure includes the following steps. Step 1 is providing a metal carrier. Step 2 is forming a first conductive wiring layer on a surface of the metal carrier. Step 3 is forming a first conductive pillar layer on a surface of the first conductive wiring layer. Step 4 is forming a first dielectric layer to cover the first conductive wiring layer and a part of the first conductive pillar layer. Step 5 is forming a second conductive wiring layer on the first dielectric layer and an end of the first conductive wiring layer, which is exposed to the first dielectric layer. The first conductive wiring layer and the second conductive wiring layer are electrically connected to each other through the first conductive pillar layer.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
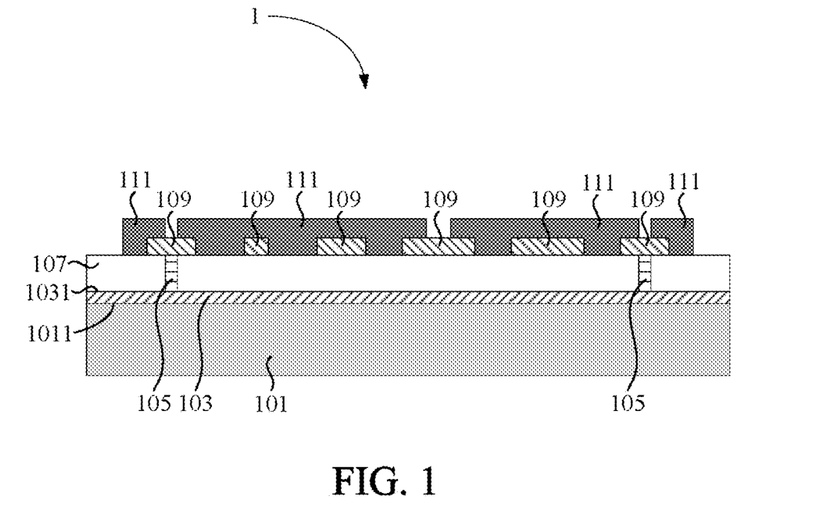
FIG. 1 is a schematic diagram showing a substrate structure according to a first embodiment of the invention.

Referring to FIG. 1, a substrate structure 1 according to a first embodiment includes a metal carrier 101, a first conductive wiring layer 103, a conductive pillar layer 105, a dielectric material layer 107, a second conductive wiring layer 109 and a protective layer 111. The conductive pillar layer 105 has a plurality of conductive pillars. The dielectric material layer 107 is a molding compound layer having Novolac-based Resin, Epoxy-based Resin, Silicone-based Resin or other suitable material. In the embodiment, the conductive pillar layer 105 has two conductive pillars.

The metal carrier 101 has a surface 1011. The first conductive wiring layer 103 has a surface 1031. The first conductive wiring layer 103 is disposed on the surface 1011 of the metal carrier 101. The dielectric material layer 107 is} disposed on the surface 1031 of the first conductive wiring layer 103. The second conductive wiring layer 109 is disposed on the dielectric material layer 107 that is partially covering the dielectric material layer 107. The conductive pillar layer 105 is disposed inside the dielectric material layer 107 and located between the first conductive wiring layer 103 and the second conductive wiring layer 109. The protective layer 111 is disposed on the dielectric material layer 107 and the second conductive wiring layer 109 that is partially covering the dielectric material layer 107 and the second conductive wiring layer 109.

In the embodiment, the metal carrier 101 may be an interference shielding layer with the function of electromagnetic interference (EMI) protection.

In the embodiment, the first conductive wiring layer 103 is a flat layer with functions of the circuit grounding and the heat radiating. In other words, the surface 1031 of the first conductive wiring layer 103 is plane without patterned.

Figure 2:
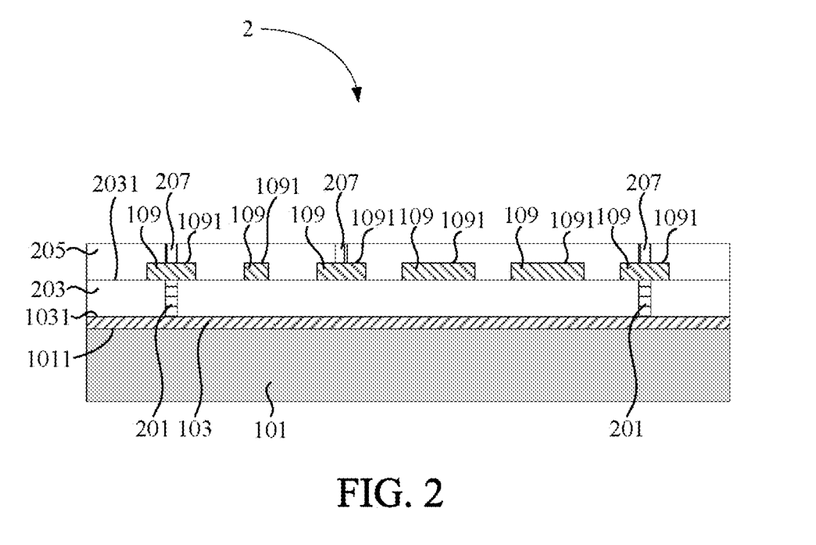
FIG. 2 is a schematic diagram showing a substrate structure according to a second embodiment of the invention.

FIG. 2 is showing a substrate structure 2 according to a second embodiment. The substrate structure 2 is similar to the substrate structure 1 of the first embodiment, wherein the substrate structure 2 further includes a first conductive pillar layer 201, a first dielectric material layer 203, a second dielectric material layer 205 and a second conductive pillar layer 207. In the second embodiment, the first conductive pillar layer 201 has a plurality of conductive pillars and the second conductive pillar layer 207 also has a plurality of conductive pillars.

In the embodiment, the first dielectric material layer 203 and the second dielectric material layer 205 are a molding compound layer, respectively, that has Novolac-based Resin, Epoxy-based Resin, Silicone-based Resin or other suitable material. The first conductive pillar layer 201 has two conductive pillars and the second conductive pillar layer 207 has three conductive pillars.

The first dielectric material layer 203 has a surface 2031 and the second conductive wiring layer 109 has a surface 1091. The second dielectric material layer 205 is disposed on the surface 1091 of the second conductive wiring layer 109 and the surface 2031 of the first dielectric material layer 203. The second conductive pillar layer 207 is disposed inside the second dielectric material layer 205 and partially electrically connected to the second conductive wiring layer 109. In other words, at least one of the conductive pillars of the second conductive pillar layer 207 has a first end and a second end, which is opposite to the first end. The first end of the conductive pillar of the second conductive pillar layer 207 is electrically connected to the second conductive wiring layer 109. The second end of the conductive pillar of the second conductive pillar layer 207 is exposed to the second dielectric material layer 205.

Figure 3:
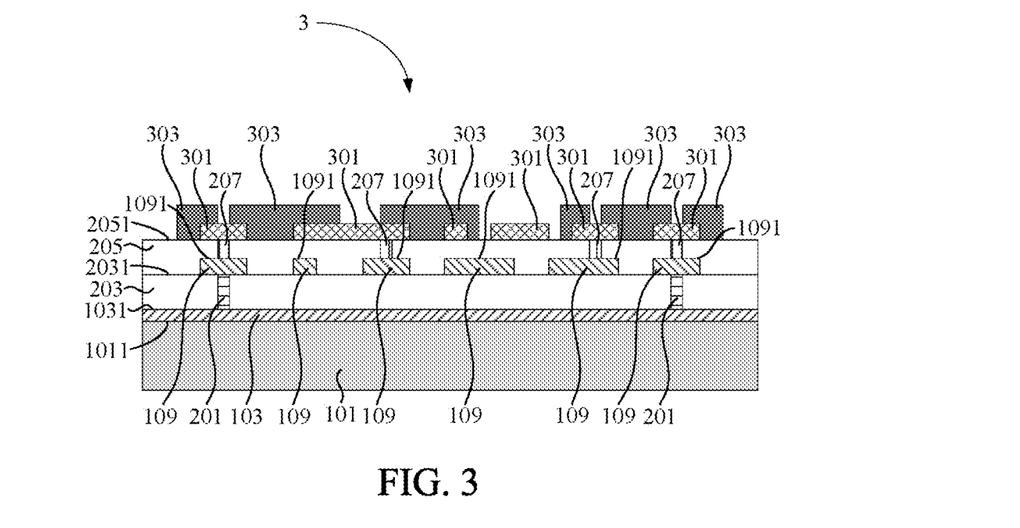
FIG. 3 is a schematic diagram showing a substrate structure according to a third embodiment of the invention.

FIG. 3 is showing a substrate structure 3 according to a third embodiment. The substrate structure 3 is similar to the substrate structure 2 of the second embodiment, wherein the substrate structure 3 further includes a third conductive wiring layer 301 and a protective layer 303.

The second dielectric material layer 205 has a surface 2051. The first conductive wiring layer 103 is disposed on the surface 1011 of the metal carrier 101. The third conductive wiring layer 301 is disposed on the surface 2051 of the second dielectric material layer 205 and partially covering the second dielectric material layer 205. The second conductive pillar layer 207 is disposed inside the second dielectric material layer 205 and located between the second conductive wiring layer 109 and the third conductive wiring layer 301. The second conductive pillar layer 207 is electrically connected to the second conductive wiring layer 109 and the third conductive wiring layer 301. The protective layer 303 is disposed on at least a part of the second dielectric material layer 205 and the third conductive wiring layer 301.

Figure 4:
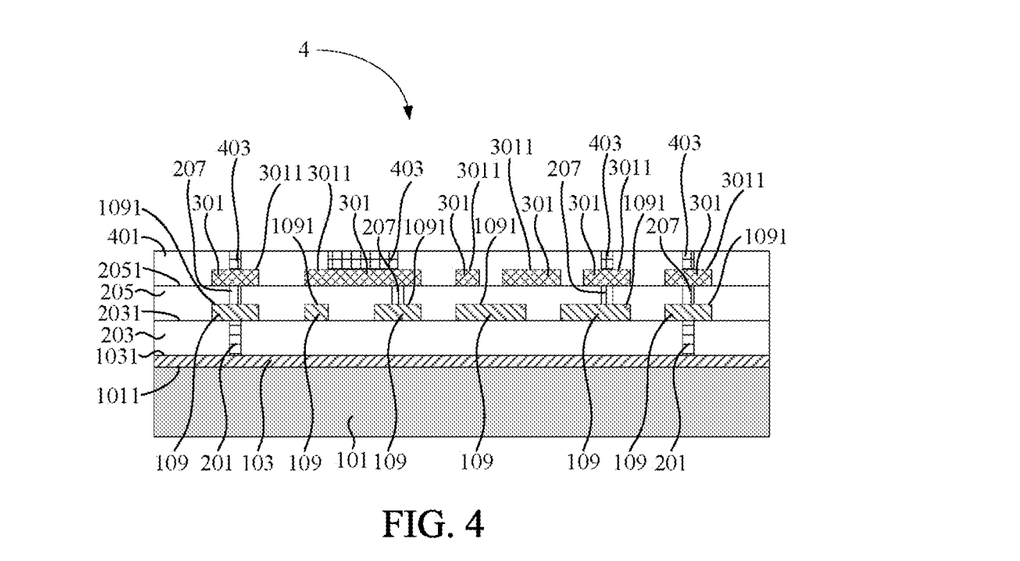
FIG. 4 is a schematic diagram showing a substrate structure according to a fourth embodiment of the invention.

FIG. 4 is showing a substrate structure 4 according to a fourth embodiment. The substrate structure 4 is similar to the substrate structure 3 of the third embodiment, wherein the substrate structure 4 further includes a third dielectric material layer 401 and a third conductive pillar layer 403. The third conductive pillar layer 403 has a plurality of conductive pillars.

The third dielectric material layer 401 is a molding compound layer having Novolac-based Resin, Epoxy-based Resin, Silicone-based Resin or other suitable material. In the fourth embodiment, the third conductive pillar layer 403 has four conductive pillars.

The third conductive wiring layer 301 has a surface 3011. The third dielectric material layer 401 is disposed on the surface 3011 of the third conductive wiring layer 301 and the surface 2051 of the second dielectric material layer 205. The third conductive pillar layer 403 is disposed inside the third dielectric material layer 401 and electrically connected to the third conductive wiring layer 301. More detailed, at least one of the conductive pillars of the third conductive pillar layer 403 has a first end and a second end, which is opposite to the first end. The first end of the conductive pillar of the third conductive pillar layer 403 is electrically connected to the third conductive wiring layer 301. The second end of the conductive pillar of the third conductive pillar layer 403 is exposed to the third dielectric material layer 401.

Figure 5:
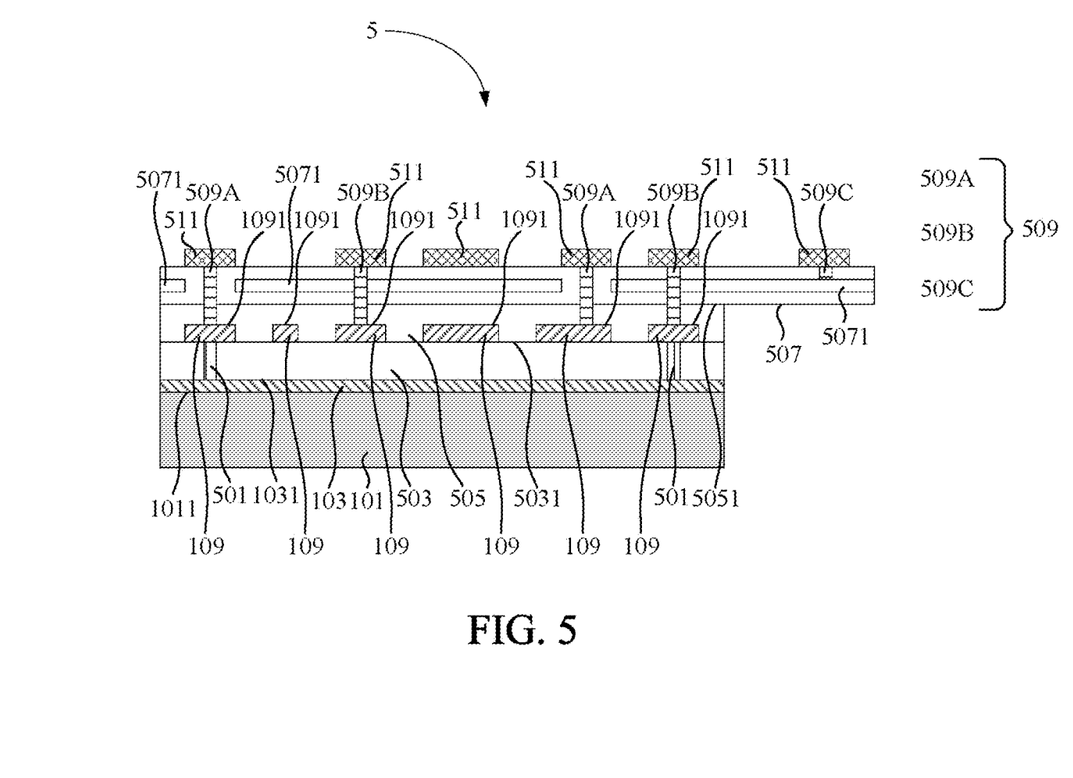
FIG. 5 is a schematic diagram showing a substrate structure according to a fifth embodiment of the invention.

FIG. 5 is showing a substrate structure 5 according to a fifth embodiment. The substrate structure 5 is similar to the substrate structure 1 of the first embodiment, wherein the substrate structure 5 further includes a first conductive pillar layer 501, a first dielectric material layer 503, a second dielectric material layer 505, a flexible circuit board 507, a second conductive pillar layer 509 and a third conductive wiring layer 511. The first conductive pillar layer 501 has a plurality of conductive pillars and the second conductive pillar layer 509 has a plurality of conductive pillars 509A, 509B and 509C.

The first dielectric material layer 503 and the second dielectric material layer 505 are a molding compound layer, respectively, that has Novolac-based Resin, Epoxy-based Resin, Silicone-based Resin or other suitable material, respectively. In the fifth embodiment, the first conductive pillar layer 501 has two conductive pillars and the second conductive pillar layer 509 has five conductive pillars 509A, 509B and 509C.

The first dielectric material layer 503 has a surface 5031. The second conductive wiring layer 109 has a surface 1091. The second dielectric material layer 505 has a surface 5051. The flexible circuit board 507 has a conductive wiring layer 5071. The second dielectric material layer 505 is disposed on the surface 1091 of the second conductive wiring layer 109 and the surface 5031 of the first dielectric material layer 503. The third conductive wiring layer 511 is disposed on the flexible circuit board 507. The second conductive pillar layer 509 is disposed inside the second dielectric material layer 505 and the flexible circuit board 507, and located between the second conductive wiring layer 109 and the third conductive wiring layer 511. The second conductive pillar layer 509 is electrically connected to the second conductive wiring layer 109 and the third conductive wiring layer 511 through the flexible circuit board 507.

More detailed, the conductive pillar 509A of the second conductive pillar layer 509 is electrically connected to the second conductive wiring layer 109 and the third conductive wiring layer 511. The conductive pillar 509B of the second conductive pillar layer 509 is electrically connected to the second conductive wiring layer 109, the third conductive wiring layer 511 and the conductive wiring layer 5071. The conductive pillar 509C of the second conductive pillar layer 509 is electrically connected to the third conductive wiring layer 511 and the conductive wiring layer 5071.

The substrate structure 1, 2, 3, 4 and 5 described above are a metal plate made of copper, aluminum, stainless steel or the combination. In addition, the substrate structure 1, 2, 3, 4 or 5 may include two or three conductive wiring layers for electrically connected to the conductive pillar of the conductive pillar layer.

Figure 6:
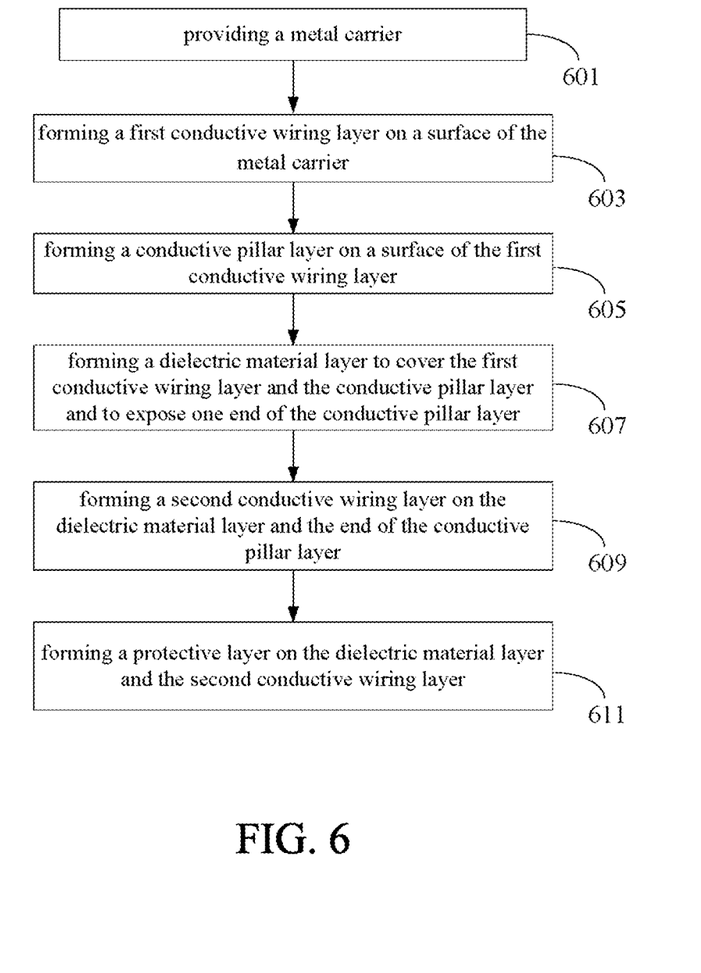
FIG. 6 is a flow chart showing a manufacturing method of a substrate structure according to a sixth embodiment of the invention.

FIG. 6 is a flow chart showing a manufacturing method of a substrate structure according to a sixth embodiment. In this embodiment, the manufacturing method may be utilized to make the substrate structure 1 of the first embodiment.

Figure 7A:
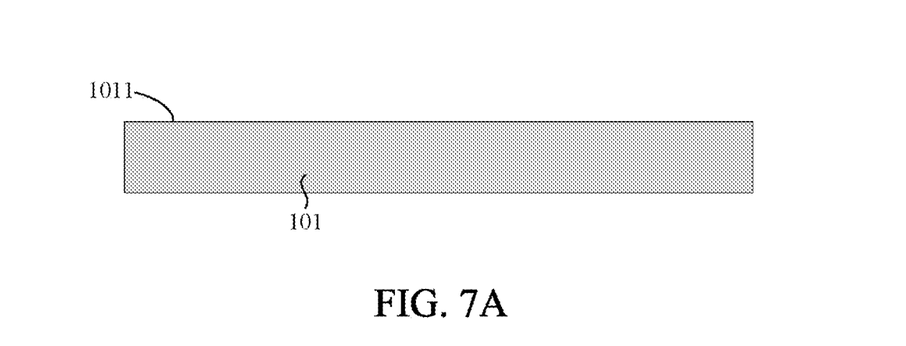
FIGS. 7A to 7F are schematic diagrams showing a manufacturing method of the substrate structure described in the sixth embodiment.

Referring to FIGS. 6 and 7A, step 601 is providing a metal carrier 101. The metal carrier 101 is a metal plate made of aluminum, copper, stainless steel or the combination.

Figure 7B:
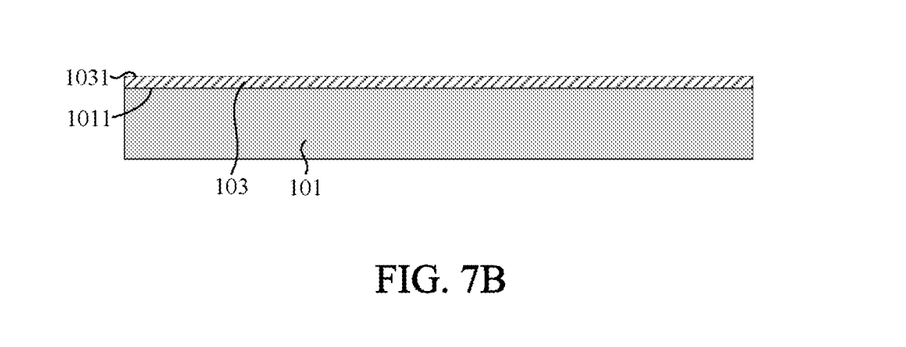

Referring to FIGS. 6 and 7B, step 603 is forming a first conductive wiring layer 103 on a surface 1011 of the metal carrier 101.

Figure 7C:
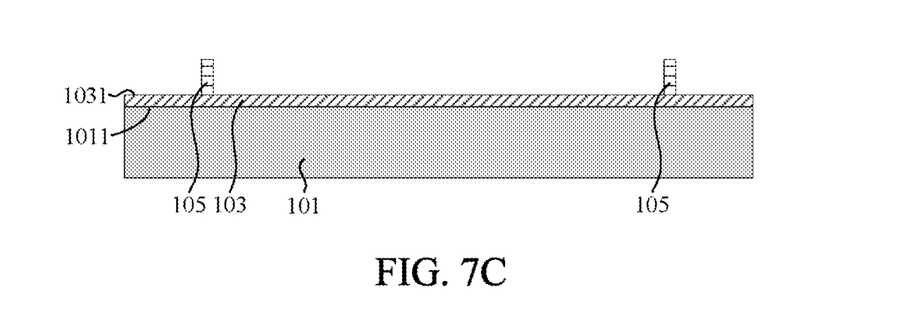

Referring to FIGS. 6 and 7C, step 605 is forming a conductive pillar layer 105 on a surface 1031 of the first conductive wiring layer 103.

Figure 7D:
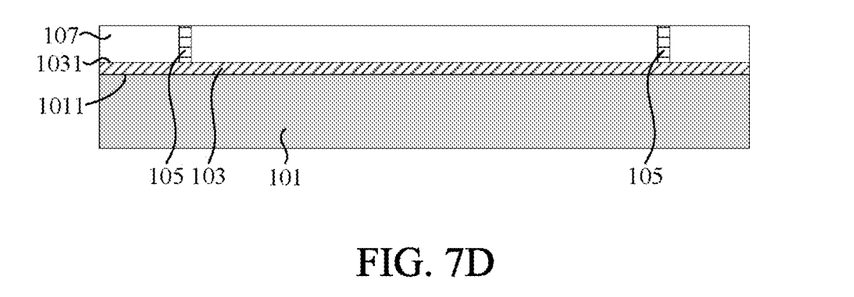

Referring to FIGS. 6 and 7D, step 607 is forming a dielectric material layer 107 to cover the first conductive wiring layer 103 and the conductive pillar layer 105 and to expose one end of the conductive pillar layer 105.

Figure 7E:
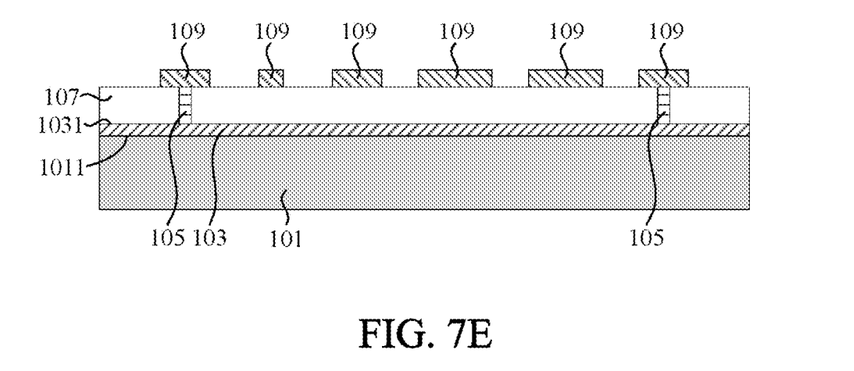

Referring to FIGS. 6 and 7E, step 609 is forming a second conductive wiring layer 109 on the dielectric material layer 107 and the end of the conductive pillar layer 105, which is exposed to the dielectric material layer 107.

Figure 7F:
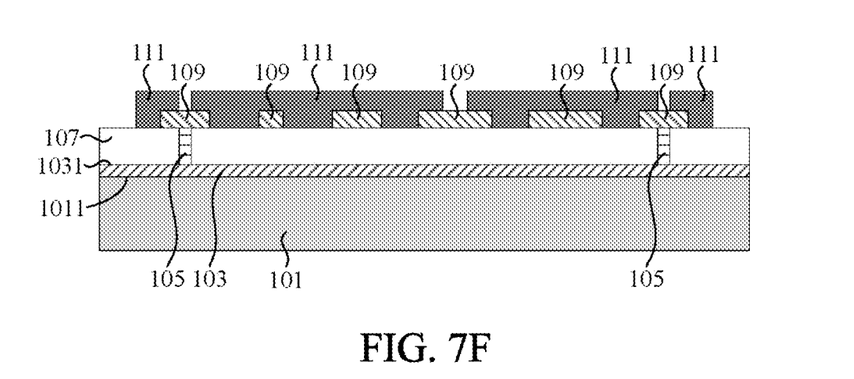

Referring to FIGS. 6 and 7F, step 611 is forming a protective layer 111 on the dielectric material layer 107 and the second conductive wiring layer 109 to partially cover the dielectric material layer 107 and the second conductive wiring layer 109.

Figure 8:
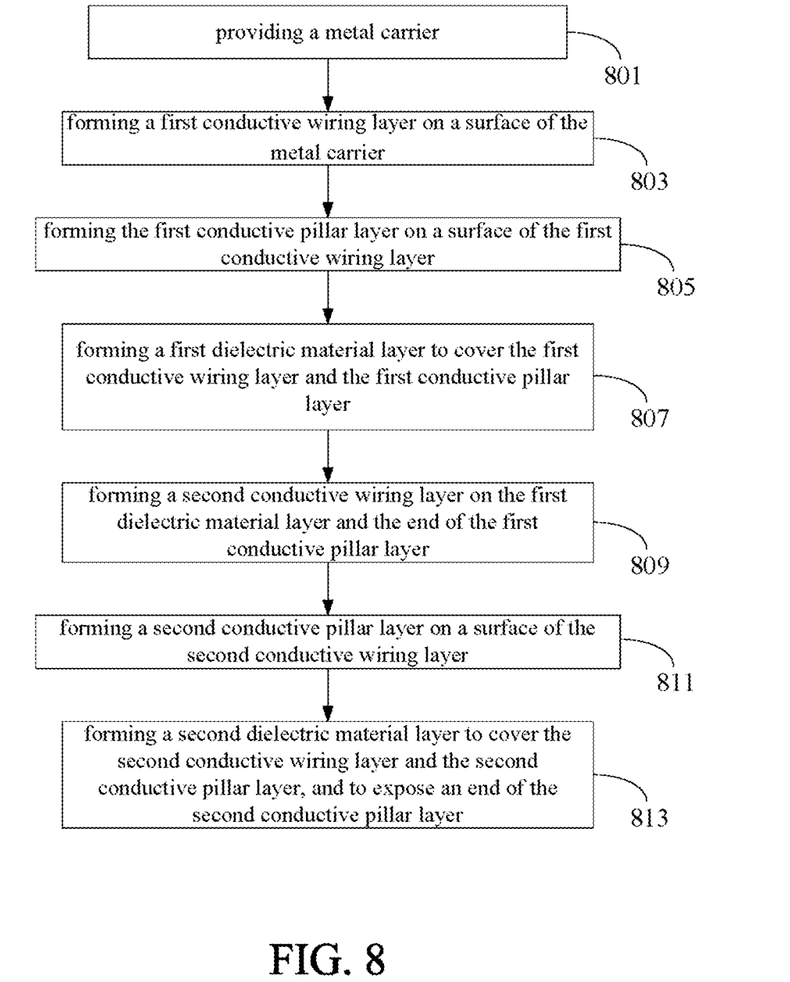
FIG. 8 is a flow chart showing a manufacturing method of a substrate structure according to a seventh embodiment of the invention.

FIG. 8 is a flow chart showing a manufacturing method of a substrate structure according to a seventh embodiment. In this embodiment, the manufacturing method may be utilized to make the substrate structure 2 of the second embodiment. In the embodiment, step 801 to step 809 is similar to step 601 to step 609.

It is to be noted, step 805 is forming the first conductive pillar layer 201 that is similar to the conductive pillar layer 105 described in step 605. Step 807 is forming a first dielectric material layer 203 that is similar to the dielectric material layer 107 described in step 607.

Figure 9A:
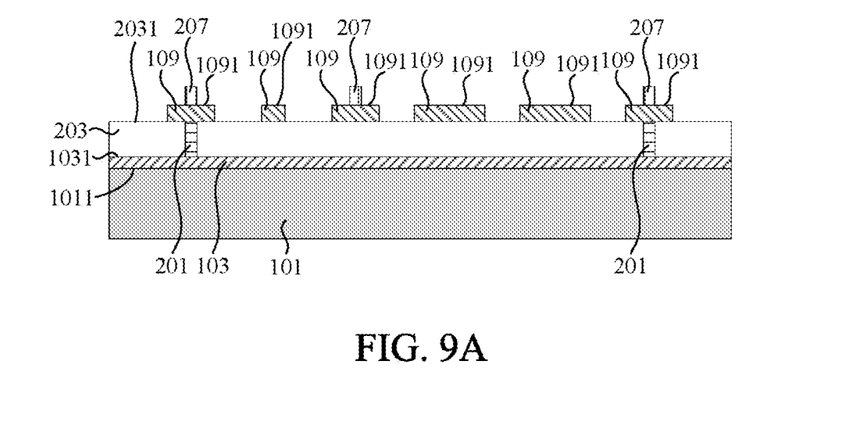
FIGS. 9A to 9B are schematic diagrams showing a manufacturing method of the substrate structure described in the seventh embodiment.

Referring to FIGS. 8 and 9A, step 811 is forming a second conductive pillar layer 207 on a surface 1091 of the second conductive wiring layer 109.

Figure 9B:
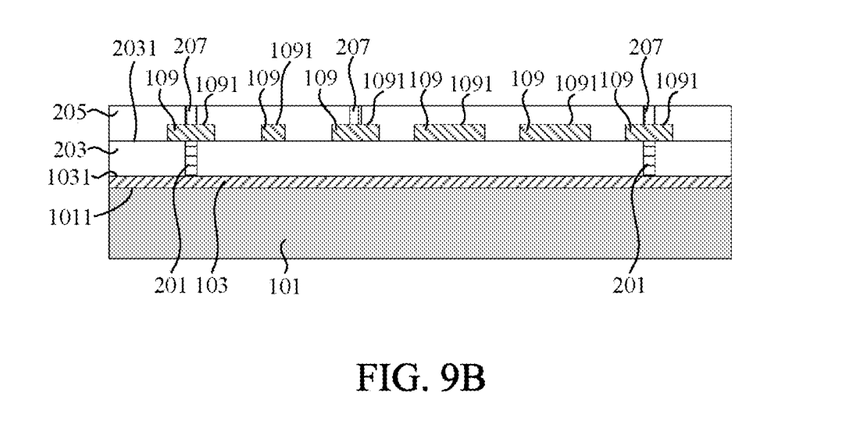

Referring to FIGS. 8 and 9B, step 813 is forming a second dielectric material layer 205 to cover the second conductive wiring layer 109 and the second conductive pillar layer 207, and to expose an end of the second conductive pillar layer 207.

Figure 10:
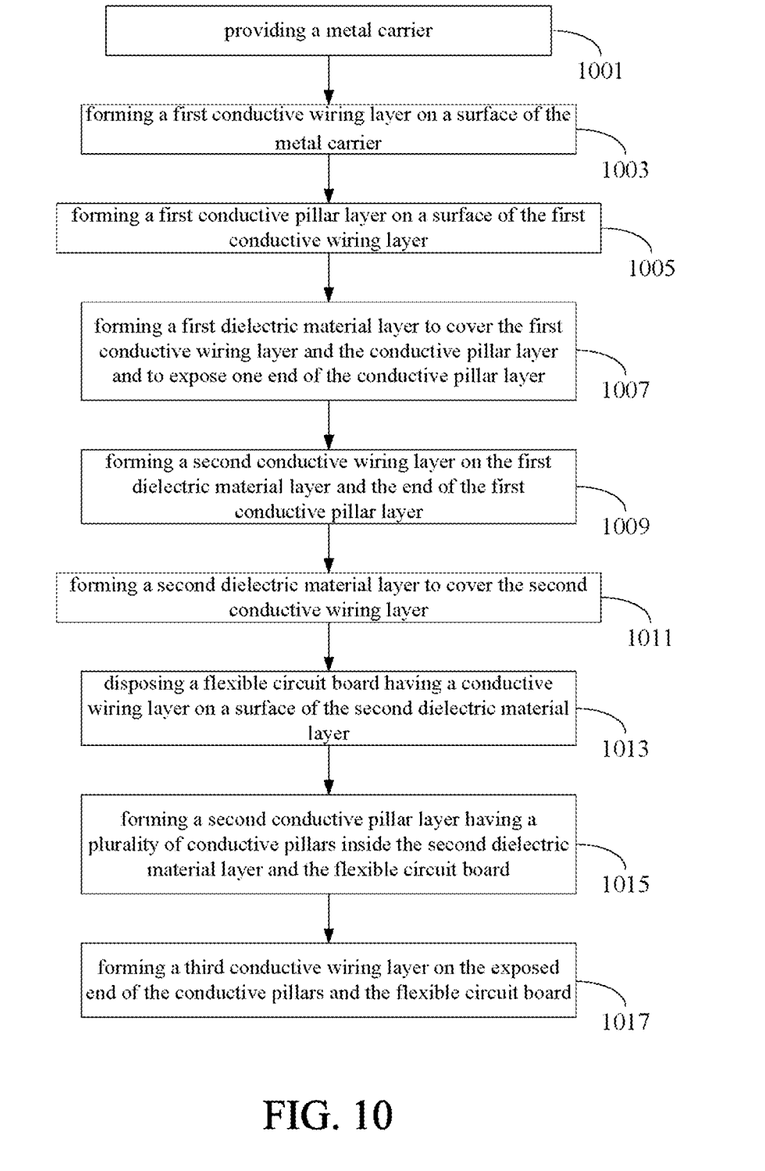
FIG. 10 is a flow chart showing a manufacturing method of a substrate structure according to an eighth embodiment of the invention.

FIG. 10 is a flow chart showing a manufacturing method of a substrate structure according to an eighth embodiment. In this embodiment, the manufacturing method may be utilized to make the substrate structure 5 of the fifth embodiment. In the embodiment, step 1001 to step 1009 is similar to step 601 to step 609.

It is to be noted, step 1005 is forming the first conductive pillar layer 501 that is similar to the conductive pillar layer 105 described in step 605. Step 1007 is forming a first dielectric material layer 503 that is similar to the dielectric material layer 107 described in step 607.

Figure 11A:
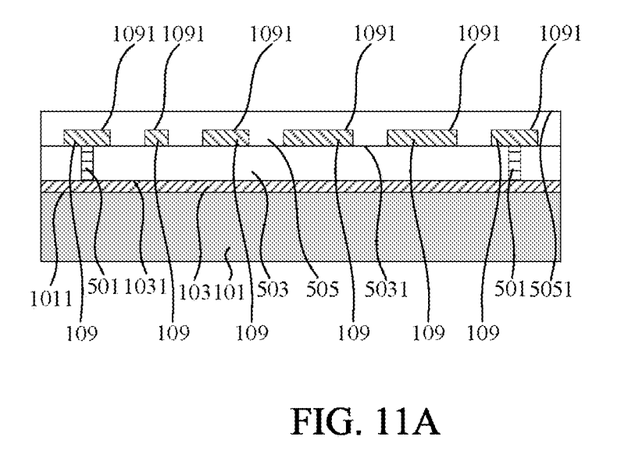
FIGS. 11A to 11D are schematic diagrams showing a manufacturing method of the substrate structure described in the eighth embodiment.

Referring to FIGS. 10 and 11A, step 1011 is forming a second dielectric material layer 505 to cover the second conductive wiring layer 109.

Figure 11B:
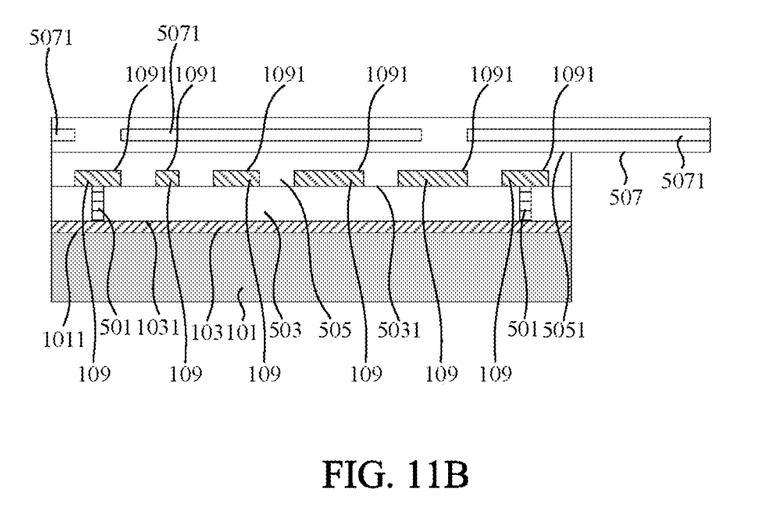

Referring to FIGS. 10 and 11B, step 1013 is disposing a flexible circuit board 507 having a conductive wiring layer 5071 on a surface 5051 of the second dielectric material layer 505.

Figure 11C:
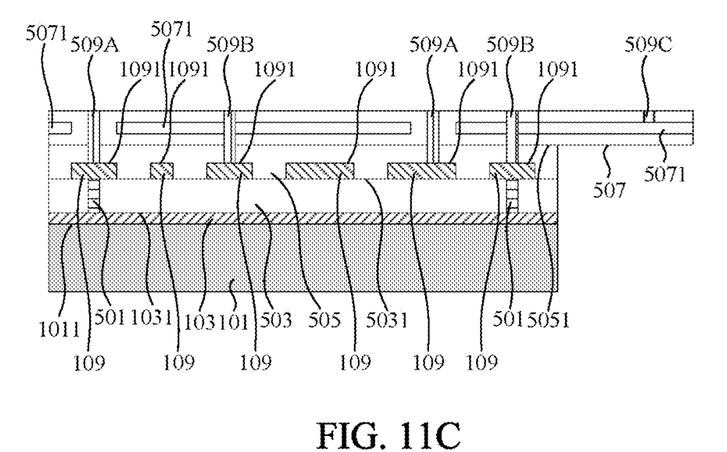

Referring to FIGS. 10 and 11C, step 1015 is forming a second conductive pillar layer 509 having a plurality of conductive pillars 509A, 509B and 509C inside the second dielectric material layer 505 and the flexible circuit board 507. In the embodiment, one end of the conductive pillars 509A, 509B and 509C is exposed to the flexible circuit board 507.

Figure 11D:
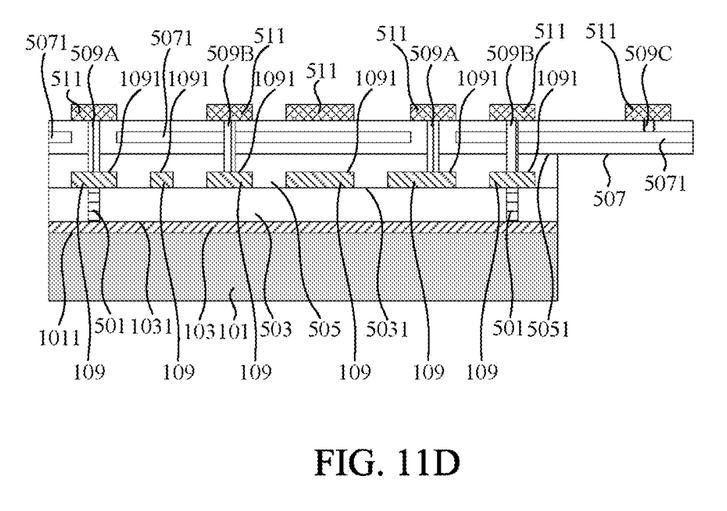

Referring to FIGS. 10 and 11D, step 1017 is forming a third conductive wiring layer 511 on the exposed end of the conductive pillars 509A, 509B and 509C and the flexible circuit board 507.

Figure 12:
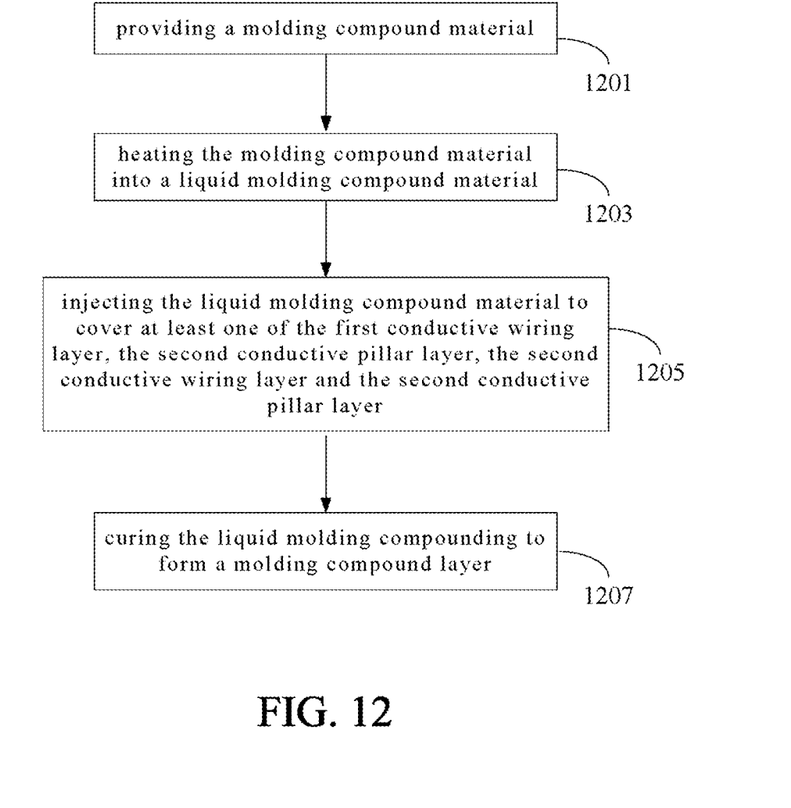
FIG. 12 is a flow chart showing a manufacturing method for making a dielectric material layer.

Additionally, steps 607, 813 and 1011 for forming the dielectric material layer further includes the following steps. As shown in FIG. 12, step 1201 is providing a molding compound material. Step 1203 is heating the molding compound material into a liquid molding compound material. Step 1205 is injecting the liquid molding compound material to cover at least one of the first conductive wiring layer, the second conductive pillar layer, the second conductive wiring layer and the second conductive pillar layer. Step 1207 is curing the liquid molding compounding to form a molding compound layer.

As mentioned above, the substrate structure of the present application utilizes the metal carrier to improve the rigid-flexible circuit board of the conventional art. The metal carrier may provide the advantage of good conductivity, high thermal efficiency and EMI protection. It is therefore the metal carrier is an important component in the invention cannot be removed from the substrate structure. In addition, comparing to the prior art, the procedure for forming the conductive wiring layer, the conductive pillar layer and the dielectric material layer is simpler. Therefore, the substrate structure and its manufacturing method of the present invention having rigidity and heat dissipation and meeting the fine line spacing, high-density, thinning tendency, low-cost and high electric characteristics.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:
1. A substrate structure, comprising:
a metal carrier;
a first conductive wiring layer being disposed on a surface of the metal carrier;
a first dielectric material layer being disposed on a surface of the first conductive wiring layer;
a second conductive wiring layer being disposed on a surface of the first dielectric material layer;
a first conductive pillar layer being disposed inside the first dielectric material layer, and disposed between the first conductive wiring layer and the second conductive wiring layer, the first conductive pillar layer has at least a first conductive pillar electrically connected to the first conductive wiring layer and the second conductive wiring layer;

a second dielectric material layer being disposed on a surface of the second conductive wiring layer and the surface of the first dielectric material layer;

a flexible circuit board being disposed on a surface of the second dielectric material layer, the flexible circuit board has a conductive wiring layer;

a third conductive wiring layer being disposed on a surface of the flexible circuit board; and a second conductive pillar layer being disposed inside the second dielectric material layer and the flexible circuit board, and disposed between the second conductive wiring layer and the third conductive wiring layer, the second conductive pillar layer has at least a second conductive pillar electrically connected to the second conductive wiring layer and the third conductive wiring layer;

wherein the at least one second conductive pillar penetrates through or partially penetrates the flexible circuit board and/or the conductive wiring layer so as to electrically connect the conductive wiring layer to the third conductive wiring layer and/or the second conductive wiring layer, and wherein the at least one second conductive pillar and the conductive wiring layer of the flexible circuit board are formed by different processes.

2. The substrate structure defined in claim 1, further comprising:

a second dielectric material layer that is disposed on a surface of the second conductive wiring layer and a surface of the first dielectric material layer;

a third conductive wiring layer; and a second conductive pillar layer having at least a second conductive material layer electrically connected to the second conductive wiring layer and the third conductive wiring layer that is disposed inside the second dielectric material layer and between the second conductive wiring layer and the third conductive wiring layer.

3. The substrate structure defined in claim 2, further comprising:

a third dielectric material layer that is disposed on a surface of the third conductive wiring layer and a surface of the second dielectric material layer; and a third conductive pillar layer having at least a third conductive pillar that is disposed inside the third dielectric material layer;

wherein the third conductive pillar having a first end and a second end, which is opposite to the first end, that the first end is electrically connected to the third conductive wiring layer and the second end is exposed to the third dielectric material layer.

4. The substrate structure defined in claim 3, wherein the third dielectric material layer is a molding compound layer, which has one of Novolac-based Resin, Epoxy-based Resin and Silicone-based Resin.

5. The substrate structure defined in claim 2, wherein the second dielectric material layer is a molding compound layer, which has one of Novolac-based Resin, Epoxy-based Resin and Silicone-based Resin.

6. The substrate structure defined in the claim 1, further comprising:

a second dielectric material layer that is disposed on a surface of the second conductive wiring layer and a surface of the first dielectric material layer; and a second conductive pillar layer having at least a second conductive pillar that is disposed inside the second dielectric material layer;

wherein the second conductive pillar having a first end and a second end, which is opposite to the first end, that the first end is electrically connected to the second conductive wiring layer and the second end is exposed to the second dielectric material layer.

7. The substrate structure defined in claim 6, wherein the second dielectric material layer is a molding compound layer, which has one of Novolac-based Resin, Epoxy-based Resin and Silicone-based Resin.

8. The substrate structure defined in claim 1, wherein the first dielectric material layer is a molding compound layer, which has one of Novolac-based Resin, Epoxy-based Resin and Silicone-based Resin.

9. The substrate structure defined in claim 1, wherein the second dielectric material layer is a molding compound layer, which has one of Novolac-based Resin, Epoxy-based Resin and Silicone-based Resin.

\* \* \* \* \*